(12) United States Patent
Minamio et al.

(10) Patent No.: US 7,923,798 B2
(45) Date of Patent: Apr. 12, 2011

(54) OPTICAL DEVICE AND METHOD FOR FABRICATING THE SAME, CAMERA MODULE USING OPTICAL DEVICE, AND ELECTRONIC EQUIPMENT MOUNTING CAMERA MODULE

(75) Inventors: Masanori Minamio, Osaka (JP); Yoshiki Takayama, Shiga (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 477 days.

(21) Appl. No.: 12/045,522

(22) Filed: Mar. 10, 2008

(65) Prior Publication Data

US 2008/0303107 A1 Dec. 11, 2008

(30) Foreign Application Priority Data

Jun. 7, 2007 (JP) ................. 2007-151739

(51) Int. Cl.
*H01L 31/0232* (2006.01)
*H01L 31/18* (2006.01)

(52) U.S. Cl. .......................... 257/432; 438/69
(58) Field of Classification Search .......... 257/432; 438/69
See application file for complete search history.

(56) References Cited

U.S. PATENT DOCUMENTS

2008/0042227 A1* 2/2008 Asano et al. ............... 257/432

FOREIGN PATENT DOCUMENTS

| JP | 04-226073 | 8/1992 |
| JP | 05-110960 | 4/1993 |
| JP | 06-232379 | 8/1994 |
| JP | 2000-138361 | 5/2000 |
| WO | WO 2006073085 A1 * | 7/2006 |

* cited by examiner

*Primary Examiner* — N Drew Richards
*Assistant Examiner* — Robert Carpenter
(74) *Attorney, Agent, or Firm* — McDermott Will & Emery LLP (57) ABSTRACT

An optical device includes a light receiving element chip having: an active region formed on a principal plane of a substrate and made by arranging a plurality of light receiving pixels; a circuit region disposed around an outer circumference of the active region; a penetrating conductor provided to penetrate the substrate in the thickness direction of the substrate; and an external connection terminal provided on a back surface of the substrate facing the principal plane thereof and connected to the penetrating conductor. The optical device further includes a microlens, a planarization film, and a transparent protective film formed on the planarization film.

10 Claims, 7 Drawing Sheets

OPTICAL DEVICE AND METHOD FOR FABRICATING THE SAME, CAMERA MODULE USING OPTICAL DEVICE, AND ELECTRONIC EQUIPMENT MOUNTING CAMERA MODULE

BACKGROUND OF THE INVENTION (a) Fields of the Invention

The present invention relates to optical devices for reading images, particularly solid-state imaging devices and their fabrication methods, camera modules using the solid-state imaging devices, and electronic equipment mounting the camera module.

(b) Description of Related Art

A solid-state imaging device reads images in the manner in which a light pattern projected onto an imaging surface by a lens or the like is stored in the form of charges by a great number of photodiodes provided on the imaging surface, and this solid-state imaging device is often employed in the field of digital cameras, cellular telephones, and in addition cameras for endoscopes or the like. In such a solid-state imaging device, the photodiode area decreases with an increase in the number of pixels, which leads to degradation of sensitivity. Therefore, the device is required to enhance the sensitivity.

One of the most commonly used methods for enhancing the sensitivity is a method for increasing the aperture ratio of a photodiode in a pixel. Increasing the aperture ratio of the photodiode itself in the pixel is, however, difficult from the viewpoint of pattern design. From this, as a method for providing an effective increase in the aperture ratio of the photodiode, use is made of a method for increasing the amount of light incident to the photodiode, that is, a method for increasing the light collection efficiency thereof. This method is implemented so that a microlens having an area smaller than the area of the pixel and larger than the area of the photodiode is formed over the surface of each pixel.

However, the thickness of a photoresist necessary for microlens formation is 2 to 3 μm, and the limit of the pattern resolution of a space between microlenses is 0.8 to 1 μm. Therefore, as the pixel area decreases, the influence of the space area, which is an unnecessary area, becomes stronger. This leads to a situation in which the effective light collection ability of the microlens to the pixel area, that is, the aperture ratio thereof cannot be increased.

Moreover, as typified by cellular telephones and the like, electronic equipment using a camera module is also required to reduce its size and thickness. Thus, for the conventional package structure in which a solid-state imaging element is disposed in a ceramic package and sealing is performed by bonding a glass plate to the front surface, it has become impossible to satisfy the above requirement. From this circumstance, another package structure is also being developed which provides flip-chip packaging by directly attaching a glass plate onto a microlens array.

For example, as a first example, the following structure is proposed (see, for example, Japanese Unexamined Patent Publication No. H5-110960): in a solid-state imaging device in which a solid-state imaging element chip with a microlens formed on an imaging area is provided over a substrate, at least part of the perimeter of the solid-state imaging element chip except the imaging area is provided with a convex wall, a transparent member is disposed on the convex wall to face the microlens, and a sealing member surrounds an area ranging from the substrate to the transparent member to hermetically seal the microlens. Such a structure can seal the microlens to prevent degradation thereof by moisture and variation in refractive index.

As a second example, another structure is proposed (see, for example, Japanese Unexamined Patent Publication No. 2000-138361): the structure includes a solid-state imaging element chip, a color filter of an inorganic material or the like which is provided on the solid-state imaging element chip and which can withstand high temperatures above 200° C., on-chip microlenses each arranged on the color filter at a position corresponding to a light receiving part of the solid-state imaging element chip, and a protective layer of a relatively hard, transparent material provided to cover the on-chip microlens, and the surface of the protective layer is planarized. By thus providing the protective layer, a dedicated package becomes unnecessary and concurrently operations for individual chips carried out after dicing can be reduced to simplify the fabrication steps. Moreover, according to the second example, the protective layer is relatively hard and its surface is planarized. Therefore, even though dust adheres thereto, it can be wiped out easily without scratching.

As a third example, still another structure is proposed (see, for example, Japanese Unexamined Patent Publication No. H6-232379): in a solid-state imaging element chip having microlenses formed over an imaging area, unevenness created by the microlenses provided on the surface portion is planarized by transparent resin having a lower refractive index than the microlens, and the top of the transparent resin is formed with a transparent protective layer having a higher mechanical strength than the transparent resin. By such a structure, the surface of the solid-state imaging element chip is planarized and the mechanical strength thereof is enhanced. Therefore, according to the third example, contamination such as dust adhering to the surface of the microlens can be removed, by a cotton swab and the like, without breaking the microlens.

As a fourth example, yet another structure is proposed (see, for example, Japanese Unexamined Patent Publication No. H4-226073): in order to mainly increase the microlens aperture ratio, the surfaces of microlenses formed by a conventional method are formed with a microlens cover film with a uniform predetermined thickness to decrease the effective space between the microlenses. This method describes the fact that the microlens cover film is made of silicon oxide ($SiO_2$), silicon nitride ($Si_3N_4$), silicon oxynitride (SiON), or the like. By thus stacking the microlens cover film on the surfaces of the microlenses, the diameters of the microlenses can substantially increase to decrease the effective space between the microlenses. This increases the effective aperture ratio in the pixel to improve the light sensitivity thereof.

In the first example described above, the device is constructed so that the solid-state imaging element chip is sandwiched between a ceramic base and a cover glass and the outer circumference thereof is sealed by sealing resin. Therefore, the sealing performance is improved, while it is difficult to reduce the thickness after packaging. Furthermore, the ceramic base is relatively expensive, which in turn causes a cost reduction problem.

In the second example described above, the surface of the relatively-hard protective layer covering the microlenses is planarized. Thereby, this process can be carried out in the state of the solid-state-imaging-element wafer formed with the multiple solid-state imaging element chips, and then the resulting wafer can be subjected to dicing. This results in cost reduction. However, in this example, the hard protective layer is formed directly on the microlenses. This example describes a concrete example in which $SiO_2$ is formed by a CVD method. When a thick $SiO_2$ film with a small thermal expansion coefficient is formed on the microlenses made of resin, stress from the protective layer may deform the microlenses to degrade the functionality as a lens. Moreover, it is difficult to form a thick protective layer. Thus, when dust or the like adheres onto the surface of the protective layer, the dust wiping applies pressure also to the microlenses to deform them and concurrently to cause cracks and the like in the protective layer. This will degrade the reliability.

In the third example described above, processing is made in the state of the solid-state-imaging-element wafer formed with the multiple solid-state imaging element chips. When the transparent protective layer with a high mechanical strength formed as the finally-provided surface is formed thick, it becomes difficult to remove a portion of the transparent protective layer located on the pad in order to establish external connection. Thus, the transparent protective layer cannot be formed thick, which causes the problem that adequate protection against the case where a mechanical force is applied by dust wiping or the like cannot be made.

In the fourth example described above, the microlens cover film also has an uneven contour similar to the microlens. Therefore, dust or the like adhering to the surface cannot be wiped, so that it becomes necessary to additionally cover the surface with a transparent member such as a cover glass. This makes it difficult to reduce its size and thickness.

SUMMARY OF THE INVENTION

In view of the foregoing, an object of the present invention is to provide an optical device having no influence on the functionality of a microlens or the like even by wiping of adhering particles such as dust, having an excellent reliability, and capable of providing small size and thickness.

To attain the above object, an optical device according to one aspect of the present invention includes: a light receiving element chip having an active region, a circuit region, a penetrating conductor, and an external connection terminal, the active region being formed on a principal plane of a substrate and made by arranging a plurality of light receiving pixels, the circuit region being disposed around an outer circumference of the active region, the penetrating conductor being provided to penetrate the substrate in the thickness direction of the substrate, the external connection terminal being provided on a back surface of the substrate facing the principal plane thereof and connected to the penetrating conductor; a microlens provided over the active region to be associated with each of the light receiving pixels; a planarization film which is formed over the principal plane of the light receiving element chip to cover the microlens and planarize unevenness of the microlens and which is made of a transparent member having a lower refractive index than the microlens; and a transparent protective film formed on the planarization film and made of a transparent inorganic material transparent to visible light.

With this structure, the external connection terminal of the light receiving element chip is provided on the back surface, so that the planarization film formed over the microlens can be formed to have a sufficiently great thickness. Then, even though the transparent protective film formed on the planarization film is formed of an inorganic material, stress affected to the microlens can be made small. Moreover, by forming the planarization film to have a great thickness, wiping of dust and the like never inhibit the functionality of the microlens. Furthermore, if this optical device is mounted to the circuit substrate or the like, the external connection terminal formed on the back surface of the light receiving element chip can implement the mounting. Therefore, connection between the circuit substrate and the external connection terminal can be facilitated, and the reliability thereof can be improved.

The optical device according to one aspect of the present invention may have the structure in which the planarization film is formed over an inner region of the light receiving element chip including a formation region of the penetrating conductor and the transparent protective film is formed to continuously expand from the top of the planarization film to an outer edge of the planarization film and further onto the principal plane of the outer circumference region of the light receiving element chip where the planarization film is not formed.

With this structure, the entire surface of the planarization film made of a resin material is covered with the transparent protective film made of an inorganic material, and the outer circumference region of the transparent protective film is formed to come into direct contact with the principal plane of the light receiving element chip, thereby enhancing the adherence therebetween. As a result of this, moisture and the like can be prevented from entering the active region formed with the microlens, and like the conventional case, the device can also have a hermetically sealed structure with a ceramic package or the like.

The optical device according to one aspect of the present invention may have the structure in which the planarization film is made of a resin material and has a thickness 2 to 300 times the thickness of the microlens, and the transparent protective film has a smaller thickness than the planarization film.

With this structure, only formation of the resin material by spin coating, printing, or the like can implement planarization. Moreover, by forming the planarization film to have a sufficiently great thickness, mechanical properties and environmental resistance can be improved. Thereby, the transparent protective film of the inorganic material can have a smaller thickness than the planarization film, and the influence of stress to the microlens can be reduced. Note that after formation of the planarization film, further planarization can be performed by, for example, CMP or the like.

A camera module according to one aspect of the present invention includes: a circuit substrate; a solid-state imaging device which is the optical device of any one of claims 1 to 3 mounted to the circuit substrate; and a lens for producing an optical image on an imaging area formed of the active region of the solid-state imaging device.

With this structure, a camera module with small size and thickness can be provided.

Electronic equipment according to one aspect of the present invention mounts the camera module according to one aspect of the present invention.

With this structure, electronic equipment with small size and thickness can be provided. Note that the electronic equipment includes various types of electronic equipment using the camera module, such as a cellular telephone, a digital camera, and a camera for an endoscope.

A method for fabricating an optical device according to one aspect of the present invention includes the steps of: preparing a light-receiving-element wafer in which a plurality of light receiving element chips each including an active region, a circuit region, a penetrating conductor, and an external connection terminal are arranged at regular arrangement pitches, the active region being formed on a principal plane of a substrate and made by arranging a plurality of light receiving pixels, the circuit region being disposed around an outer circumference of the active region, the penetrating conductor being provided to penetrate the substrate in the thickness direction of the substrate, the external connection terminal being provided on a back surface of the substrate facing the principal plane thereof and connected to the penetrating conductor; forming, in the state of the light-receiving-element wafer, a microlens over the active region to be associated with each of the light receiving pixels; forming, in the state of the light-receiving-element wafer, a planarization film over the principal plane of the light receiving element chip to cover the microlens and planarize unevenness of the microlens, the planarization film being made of a transparent member having a lower refractive index than the microlens; removing, in the state of the light-receiving-element wafer, portions of the planarization film located in and around a dicing region for cutting the wafer into the light receiving element chips, thereby exposing portions of the principal plane of the substrate; forming, in the state of the light-receiving-element wafer, a transparent protective film on the planarization film, the transparent protective film being made of a transparent inorganic material transparent to visible light; and subjecting the light-receiving-element wafer to dicing along the dicing region to cut the wafer into chips.

With this method, the optical device can be easily fabricated which is constructed so that the transparent protective film is formed to continuously expand from the top of the planarization film to an outer edge of the planarization film and further onto the principal plane of the outer circumference region of the light receiving element chip where the planarization film is not formed.

The method for fabricating an optical device according to one aspect of the present invention further includes the step of polishing the planarization film before the step of forming the transparent protective film.

With this method, the planarization film can also be formed of an optically-transparent flat plane, and thus the transparent protective film formed on the planarization film can easily be formed of a transparent flat plane.

In the method for fabricating an optical device according to one aspect of the present invention, the transparent protective film may be formed by a chemical vapor deposition (CVD) method, a plasma assisted chemical vapor deposition (PCVD) method, a spin-on-glass (SOG) method, or a sol-gel method.

With this method, the transparent protective film can be easily formed to have a uniform thickness and to continuously expand from the top of the planarization film to an outer edge of the planarization film and further onto the principal plane of the outer circumference region of the light receiving element chip where the planarization film is not formed.

As described above, in the optical device according to one aspect of the present invention, by providing the external connection terminal of the light receiving element chip on the back surface, the planarization film can be formed to have a sufficiently great thickness. Moreover, by forming the transparent protective film on the planarization film, stress to the microlens can be reduced and concurrently inhibition of the functionality of the microlens and the like can be prevented even by wiping of adhering particles such as dust. Furthermore, the conventional structure in which the device is hermetically sealed in a ceramic package is not required. This provides an especially useful effect that can provide an optical device with small size and thickness at low cost.

BRIEF DESCRIPTION OF THE DRAWINGS

FIGS. 2A to 2D are sectional views showing main process steps for explaining a method for fabricating a solid-state imaging device according to the first embodiment of the present invention.

DETAILED DESCRIPTION OF THE PREFERRED EMBODIMENTS

Embodiments of the present invention will be described below with reference to the accompanying drawings. In the embodiments, it goes without saying that the thicknesses, the lengths, and the like of the components shown in each figure are not identical to those of the actual shapes from the viewpoint of creation of the figures and that they are not limited to the illustrated structures. Furthermore, it goes without saying that the numbers of penetrating electrodes and external connection terminals are not identical to those of the actual device but the numbers obtained in consideration of convenience of illustration and description and that they are not limited to the illustrated structures.

First Embodiment

Figure 1A:
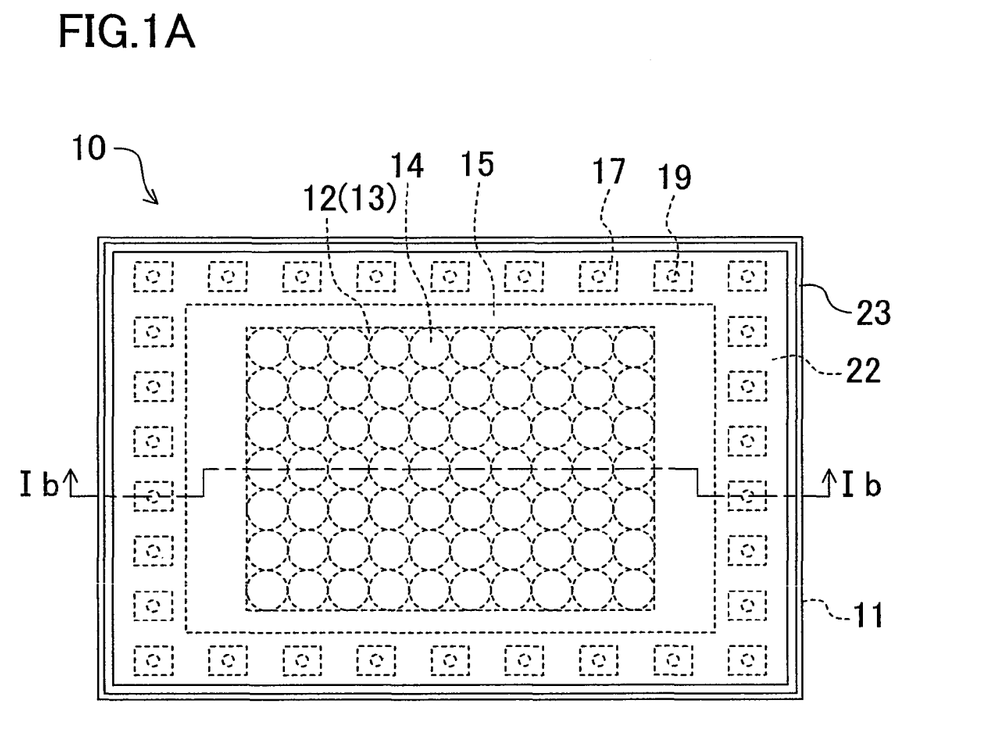
FIG. 1A is a plan view showing the structure of an optical device according to a first embodiment of the present invention.
Figure 1B:
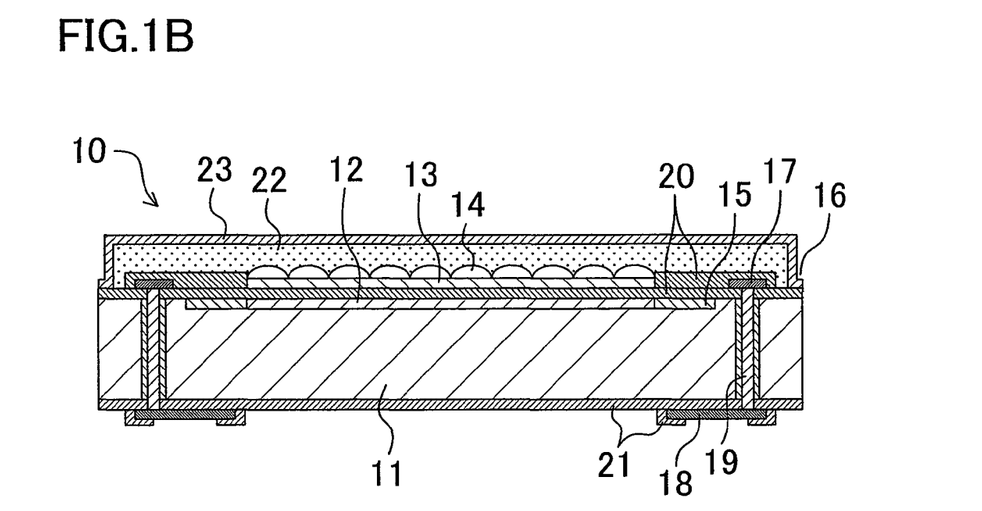
FIG. 1B is a sectional view taken along the line Ib-Ib in FIG. 1A.

FIGS. 1A and 1B are views showing the structure of an optical device according to a first embodiment of the present invention. FIG. 1A is a plan view thereof, and FIG. 1B is a sectional view taken along the line Ib-Ib. In the first embodiment, as the optical device, a solid-state imaging device employed in a digital camera and the like will be described as one example. In the following description, the optical device is represented as a solid-state imaging device 10.

The solid-state imaging device 10 according to the first embodiment is mainly composed of a light receiving element chip, microlenses 14, a planarization film 22, and a transparent protective film 23. The light receiving element chip includes an active region 12, a circuit region 15, a penetrating conductor 19, and an external connection terminal 18. The active region 12 is formed on the principal plane of a substrate 11, and made by arranging a plurality of light receiving pixels. The circuit region 15 is disposed around the outer circumference of the active region 12. The penetrating conductor 19 is provided to penetrate the substrate 11 in the thickness direction of the substrate 11. The external connection terminal 18 is provided on the back surface of the substrate 11 facing the principal plane thereof and connected to the penetrating conductor 19.

The microlenses 14 are provided over the light receiving pixels located on the active region 12 of the light receiving element chip with a color filter 13 interposed therebetween, and they are arranged at positions associated with the respective light receiving pixels. The planarization film 22 is made of a transparent member having a lower refractive index than the microlens 14, and formed over the principal plane of the light receiving element chip to cover the microlenses 14 and planarize unevenness of the microlenses 14. On the planarization film 22, the transparent protective film 23 of a transparent inorganic material is formed.

In the solid-state imaging device 10 according to the first embodiment, the planarization film 22 and the transparent protective film 23 shown above further have structures as described below. To be more specific, the planarization film 22 is formed on an inner region of the light receiving element chip including the formation region of the penetrating conductor 19, while the transparent protective film 23 is formed to continuously expand from the top of the planarization film 22 to an outer edge of the planarization film 22 and further onto the principal plane of an outer circumference region 16 of the light receiving element chip where the planarization film 22 is not formed.

The components of the above-described solid-state imaging device according to the first embodiment will be further described below in detail.

As the substrate 11 of the light receiving element chip, a single-crystal silicon substrate can be used. However, use can also be made of a substrate of a compound semiconductor such as GaAs, an SOI substrate, a substrate with a polycrystalline silicon film formed on a glass substrate, or the like. The first embodiment describes an example in which a single-crystal silicon substrate is used.

In a center portion of the principal plane of the substrate 11, the active region 12 is formed in which a plurality of light receiving pixels composed of photodiodes are arranged in rows and columns, and this region functions as an imaging area. Around the active region 12, the circuit region 15 is provided which is formed with various circuits such as a signal scanning circuit, an output amplifier circuit, and a power supply circuit. Further, in the light receiving element chip, around the circuit region 15, a plurality of connection electrodes 17 are disposed which are connected to an input/output circuit and a power supply circuit. Each of the connection electrodes 17 is connected to the corresponding penetrating electrode 19 penetrating the substrate 11 from the principal plane to the back surface. Note that the technique for forming a penetrating electrode in a singly-crystal silicon substrate is publicly known.

On the back surface of the substrate 11, the external connection terminal 18 is provided which is connected to the penetrating electrode 19. Protective insulating films 20 and 21 are formed in order to protect the active region 12, the circuit region 15, the connection electrode 17, the external connection terminal 18, and the like. As the protective insulating films 20 and 21, use can be made of a protective insulating film normally employed in the silicon semiconductor technology, such as a silicon oxide (SiO) film, a silicon nitride (SiN) film, or a silicon oxynitride (SiON) film. The color filter 13 is formed on the light receiving pixels formed in the active region 12, and on the color filter 13, the microlenses 14 are formed in lows and columns to be associated with the respective light receiving pixels.

The planarization film 22 formed over the microlenses 14 can be formed of resin made by synthesizing heat-resistant acrylic-based resin and fluorocarbon-based resin having a lower refractive index than the microlens 14 of acrylic-based resin having a refractive index of 1.49 to 1.51. Note that the formed resin has a refractive index of 1.35 to 1.45. However, the material for the planarization film 22 is not limited to this resin material, and use may be made of transparent resin synthesized using, instead of the heat-resistant acrylic-based resin, one type or two or more types of epoxy-based resin, polycarbonate-based resin, polyethylene-based resin, polyolefin-based resin, polystyrene-based resin, polyurethane-based resin, polyimide-based resin, and silicone-based resin. It is desirable that the film has an adequate thickness in order to prevent deformation or surface damages of the microlens 14 during the fabrication process and also to avoid the influence to the microlens 14 exerted by wiping of adhering dust particles during an assembly process and the like. In order to form the planarization film 22 without performing any special processing for planarization, the thickness thereof is preferably two or more times the thickness of the microlens 14. On the other hand, it is sufficient that the upper limit of thickness of the planarization film 22 is set at 300 times or less the thickness of the microlens 14. As a concrete thickness of the film, since the microlens 14 generally has a thickness of about 2 μm, it is preferably 4 μm or more, and in consideration of the formation process, preferably 40 μm or less. Moreover, a thickness of 10 to 25 μm is more preferable from the viewpoint of the securing of strength. In consideration of compatibility with already-existing products, it may be 100 to 600 μm.

Preferably, the transparent protective film 23 has a smaller thickness than the planarization film 22 in order to prevent degradation of thermal properties of the microlens 14 and the color filter 13 and deformation and surface damages of the microlens 14 caused by external forces during fabrication processes, or to reduce the influence of stress caused by the transparent protective film 23 made of an inorganic material. To be more specific, the thickness preferably ranges from 1 to 10 μm, more preferably from 3 to 7 μm. The transparent protective film 23 can be formed of a transparent inorganic material transparent to visible light, for example, silicon oxide (SiO) or the like by a chemical vapor deposition (CVD) method, a plasma assisted chemical vapor deposition (PCVD) method, a spin-on-glass (SOG) method, or a sol-gel method. By forming the transparent protective film 23 using such a method, it can certainly cover the planarization film 22, and also certainly intercept moisture even though the planarization film 22 has moisture permeability. Accordingly, high reliability can be attained.

As the microlens 14, use can be made of not only acrylic-based resin having a refractive index of 1.49 to 1.51 but also a resin material having a refractive index of about 1.6 to 1.8. In this case, it is sufficient that the planarization film 22 is formed of a resin material having a lower refractive index than this index.

As the transparent protective film 23, use can be made of not only SiO but also a material containing low-phosphorus-concentration borosilicic acid, silicon nitride (SiN), aluminum oxide (AlO) or the like. Moreover, not only a single-layer structure made of one selected from these materials but also a stacked structure made of two or more selected from these materials may be employed thereas.

As can be seen from FIGS. 1A and 1B, the planarization film 22 is not formed on the principal plane of the outer circumference region 16 of the light receiving element chip, and the protective insulating film 20 is exposed in the outer circumference region 16. The transparent protective film 23 is formed with a nearly uniform thickness to continuously expand from the top of the planarization film 22 to the perimeter of the planarization film 22 and the principal plane of the outer circumference region 16 of the light receiving element chip.

With such a structure, the planarization film 22 can be formed of a resin material with a great thickness. In addition to this, the transparent protective film 23 of an inorganic material has an excellent mechanical strength and an excellent moisture interception capability. Therefore, even though, for example, dust or the like is wiped, degradation of the reliability caused by the wiping can be prevented. Furthermore, unlike the conventional technique, the necessity to hermetically seal the device with a ceramic package or the like is eliminated, so that a highly-reliable solid-state imaging device 10 can be provided at low cost.

Hereinafter, a fabrication method of the solid-state imaging device 10 according to the first embodiment will be described in detail with reference to FIGS. 2A to 2D.

Figure 2A:
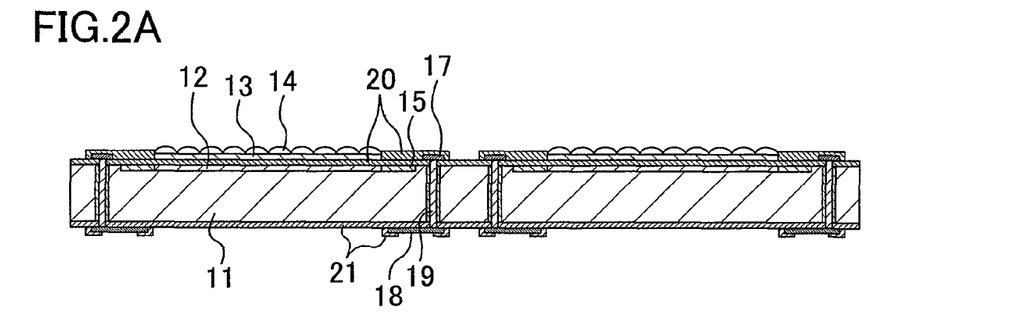
FIG. 2A is a sectional view showing the state of a light-receiving-element wafer in which multiple light receiving element chips are arranged at regular arrangement pitches.
Figure 2B:
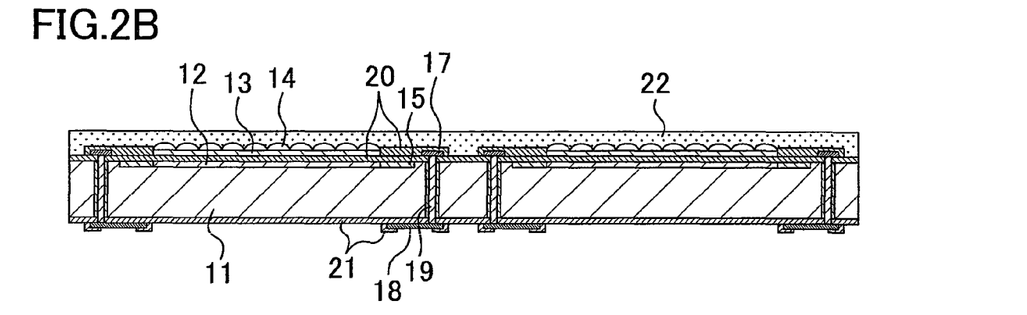
FIG. 2B is a sectional view showing the state in which a planarization film is formed on the principal plane of the light-receiving-element wafer.
Figure 2C:
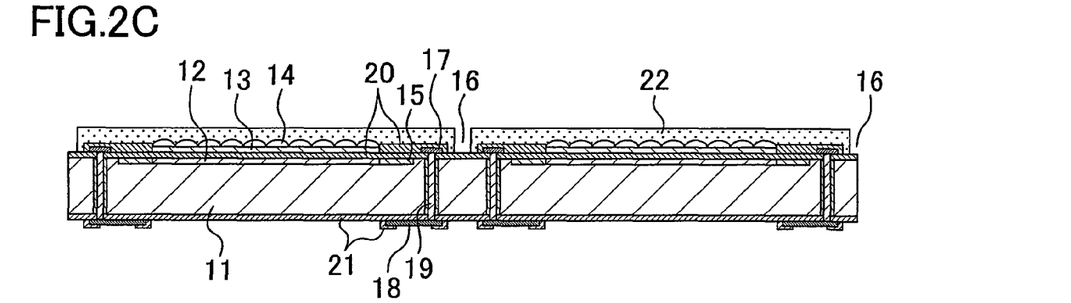
FIG. 2C is a sectional view showing the state in which portions of the planarization film in and around a dicing region for cutting the light-receiving-element wafer into the light receiving element chips are removed.
Figure 2D:
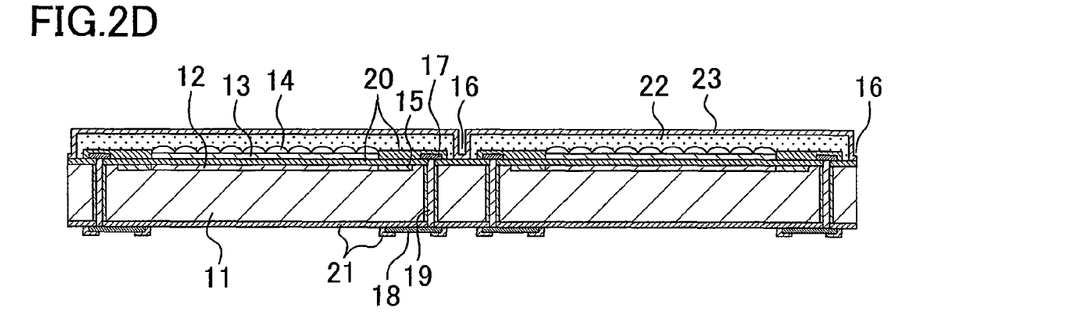
FIG. 2D is a sectional view showing the state in which a transparent protective film is formed using a transparent inorganic material.

FIGS. 2A to 2D are sectional views showing main process steps for explaining the fabrication method of the solid-state imaging device 10 according to the first embodiment. FIG. 2A is a sectional view showing the state of a light-receiving-element wafer in which the multiple light receiving element chips are arranged at regular arrangement pitches, FIG. 2B is a sectional view showing the state in which the planarization film 22 is formed on the principal plane of the light-receiving-element wafer, FIG. 2C is a sectional view showing the state in which portions of the planarization film 22 in and around a dicing region for cutting the light-receiving-element wafer into the light receiving element chips are removed, and FIG. 2D is a sectional view showing the state in which the transparent protective film 23 is formed using a transparent inorganic material.

Referring to FIG. 2A, first, the light-receiving-element wafer in which the microlenses 14 have been formed is prepared. The light-receiving-element wafer is constructed by arranging, at regular arrangement pitches, the multiple light receiving element chips each composed of: the active region 12 having a plurality of light receiving pixels arranged on the principal plane of the substrate 11; the circuit region 15 disposed in an outer circumference portion of the active region 12; the penetrating conductor 19 provided to penetrate the substrate 11 in the thickness direction of the substrate 11; and the external connection terminal 18 provided on the back surface of the substrate 11 facing the principal plane thereof and connected to the corresponding penetrating conductor 19. Note that as described above, only two light receiving element chips are illustrated in FIGS. 2A to 2D for the convenience of illustration and description. Then, in the state of the light-receiving-element wafer, the microlenses 14 are formed over the active region 12 at locations corresponding to the light receiving pixels of the active region 12, thereby providing the structure shown in FIG. 2A.

Next, as shown in FIG. 2B, in the state of the light-receiving-element wafer, the planarization film 22 of a transparent member having a lower refractive index than the microlens 14 is formed over the principal plane of the light receiving element chip to cover the microlenses 14. Formation of the planarization film 22 is done in the manner in which, for example, transparent, photosensitive liquid resin composed of fluorocarbon-based resin and heat-resistant acrylic-based resin and mixed with photoinitiator and curing agent is applied to the entire surface of the principal plane of the light-receiving-element wafer. The application method may be, for example, a spin coat method or a screen printing method. In the case of applying the photosensitive liquid resin by a spin coat method, a condition adjusted at a predetermined viscosity and set at a predetermined number of revolutions can be employed to easily form a film with a required thickness. Alternatively, the film may be formed with a predetermined thickness in the manner in which photosensitive liquid resin adjusted at a low viscosity is first applied onto the microlens 14 and then a photosensitive liquid resin adjusted at a high viscosity is further applied onto the first-formed resin. In the case where the photosensitive liquid resin is applied by a screen printing method, the entire surface of the principal plane of the light-receiving-element wafer is subjected to screen printing using a printing mask, thereby easily providing the film with a predetermined thickness.

When the planarization film 22 is formed using such photosensitive liquid resin, it is necessary to prevent the occurrence of bubbles. In order to attain this prevention, before coating with the photosensitive liquid resin, the surface of the microlens 14 and the principal plane of the light-receiving-element wafer may be treated with, for example, oxygen plasma to conduct surface modification and cleaning. Moreover, the photosensitive liquid resin may be applied in a reduced pressure atmosphere with the temperature kept within the range of 40 to 70° C., preferably at about 55° C.

Subsequently, as shown in FIG. 2C, portions of the planarization film 22 are removed which are located in and around the dicing region for cutting the light-receiving-element wafer into the light receiving element chips, that is, in the outer circumference region 16 of the light receiving element chip, thereby exposing part of the principal plane of the substrate 11. The exposed area is formed as follows. After application of photosensitive liquid resin, pre-bake is performed. Thereafter, light exposure is performed using a photomask and then development is performed to remove only a portion of the planarization film 22 located on the outer circumference region 16 of the light receiving element chip. Then, curing by heating is performed to form the planarization film 22 in the state in which the principal plane of the light receiving element chip is exposed in the outer circumference region 16. The thickness of the planarization film 22 in this state is set at 10 to 25 μm as described above.

As shown in FIG. 2D, on the planarization film 22, the transparent protective film 23 is formed using a transparent inorganic material. The transparent protective film 23 is formed by a CVD method, a PCVD method, an SOG method, or a sol-gel method. As the material for this film, use can be made of, for example, SiO, a low-phosphorus-concentration borosilicic acid material, SiN, AlO, or the like. Moreover, not only a single-layer structure made of one selected from these materials but also a stacked structure made of two or more selected from these materials may be employed thereas. For example, in the case of using the transparent protective film 23 of SiO, a PCVD method using a mixed gas of $SiH_4$ and $O_2$ or a mixed gas of $SiH_4$ and $N_2O$ can be employed to form, at a relatively low temperature of 250° C. or less, the transparent protective film 23 having a good coverage and an excellent mechanical strength. Its thickness may be, for example, about 5 μm.

After a series of processes in the state of the light-receiving-element wafer, the resulting wafer is subjected to dicing along the dicing region to cut the wafer into individual chips. Thereby, the solid-state imaging device 10 can be fabricated.

The planarization film 22 may be polished before the formation step of the transparent protective film 23. Although planarization can be attained by forming the film by an application method, it is difficult for this method to attain planarization to the extent that can provide a mirror finished surface. From this, the transparent protective film 23 may be formed after the planarization film 22 is polished to the extent that can provide a mirror finished surface. As the polishing method, for example, a CMP polishing method can be employed.

Moreover, before formation of the transparent protective film 23, the surface of the planarization film 22 may be treated with, for example, oxygen plasma to conduct surface modification. By thus performing surface modification, the adherence between the transparent protective film 23 and the planarization film 22 can be improved.

The transparent protective film 23 with a predetermined thickness may be formed in the manner in which the film 23 formed thicker than the predetermined thickness is subjected to CMP to provide a mirror-finished surface and the predetermined thickness. Such processing can be performed to provide the transparent protective film 23 with a mirror-finished surface. Moreover, the surface of the transparent protective film 23 likely to exert an influence of stress on the planarization film 22 can be thinned, and portions of the transparent protective film 23 formed on the outer edge of the planarization film 22 and the outer circumference region 16 of the principal plane can be thickened. Thereby, the moisture permeability from the edge portion can be further reduced.

Figure 3:
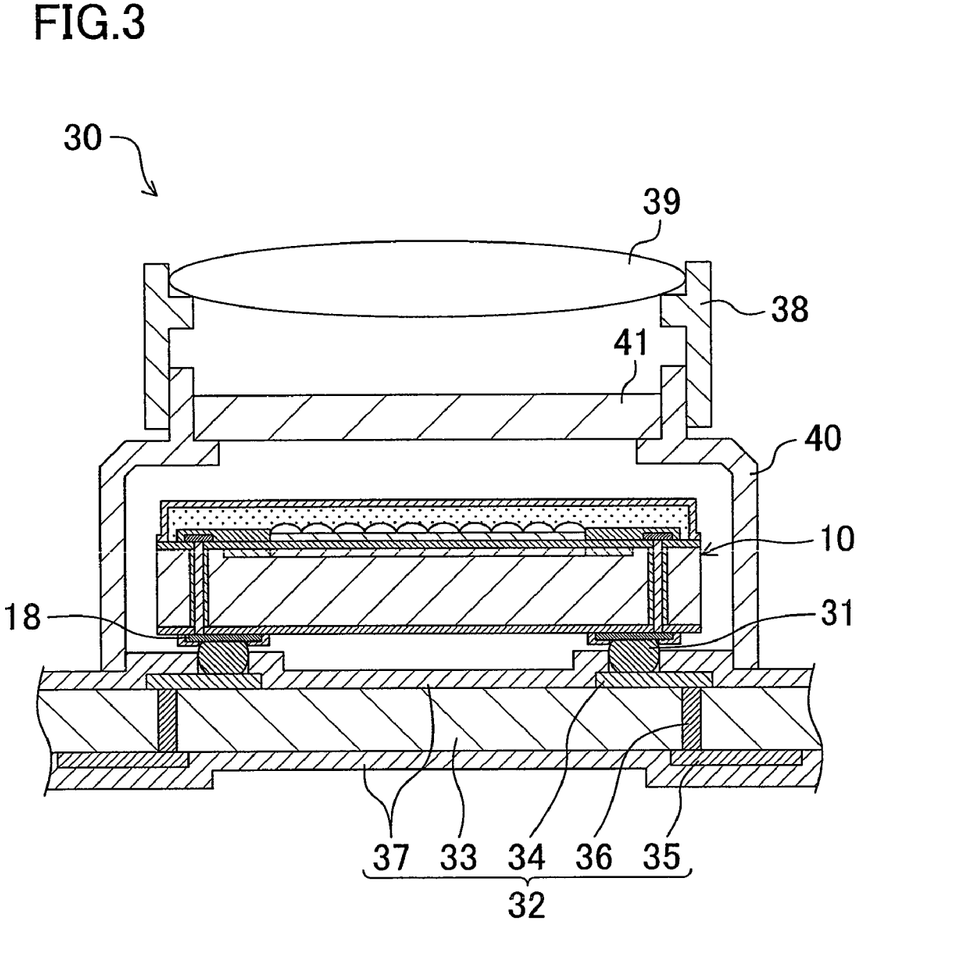
FIG. 3 is a sectional view showing the structure of a camera module as a first example which uses the solid-state imaging device according to the first embodiment of the present invention.

FIG. 3 is a sectional view showing the structure of a camera module 30 as a first example which uses the solid-state imaging device 10 according to the first embodiment.

Referring to FIG. 3, the camera module 30 includes a circuit substrate 32, the solid-state imaging device 10 mounted to the circuit substrate 32, and a lens 39 for producing an optical image on an imaging area of the solid-state imaging device 10.

In the circuit substrate 32, an interconnect electrode 34 is formed on the top surface of a resin base 33 made of, for example, glass epoxy resin or the like, and an interconnect electrode 35 is formed on the back surface thereof These interconnect electrodes 34 and 35 are electrically connected to each other by a penetrating conductor 36. In addition, over the surfaces of the interconnect electrodes 34 and 35 and the resin base 33, a resin coating 37 for protecting them is formed. The circuit substrate 32 is not limited to the structure described above, and any structure in which the solid-state imaging device 10 can be mounted thereto may be employed.

To the circuit substrate 32, the solid-state imaging device 10 according to the first embodiment is mounted. In the case of this camera module 30, a conductive member 31 of a solder ball connects the external connection terminal 18 of the solid-state imaging device 10 and the interconnect electrode 34 of the circuit substrate 32. As the conductive member 31, use may be made of not only the solder ball but also a resin ball having a conductive coating applied onto its surface. Alternatively, a solder bump may be formed on the external connection terminal 18. In the case of employing a solder bump or a solder ball, use can be made of solder materials of various compositions, such as Sn—Ag—Cu-based, Sn—Ag—Bi-based, or Zn—Bi-based material. The conductive member 31 may be formed of a plated bump in which by electrolytic or electroless plating or the like, a core of gold, copper, nickel, or the like is formed on the external connection terminal 18 and the surface of the core is formed with a thin conductive layer capable of being soldered.

Furthermore, a housing 40 is fixed onto the circuit substrate 32, and a lens barrel 38 including the optical lens 39 is attached to the housing 40. An optical component 41 such as an infrared filter is also attached into the housing 40.

The camera module 30 is thus constructed, and the solid-state imaging device 10 has small size and thickness. Therefore, the camera module 30 with small size and thickness can also be provided.

Figure 4:
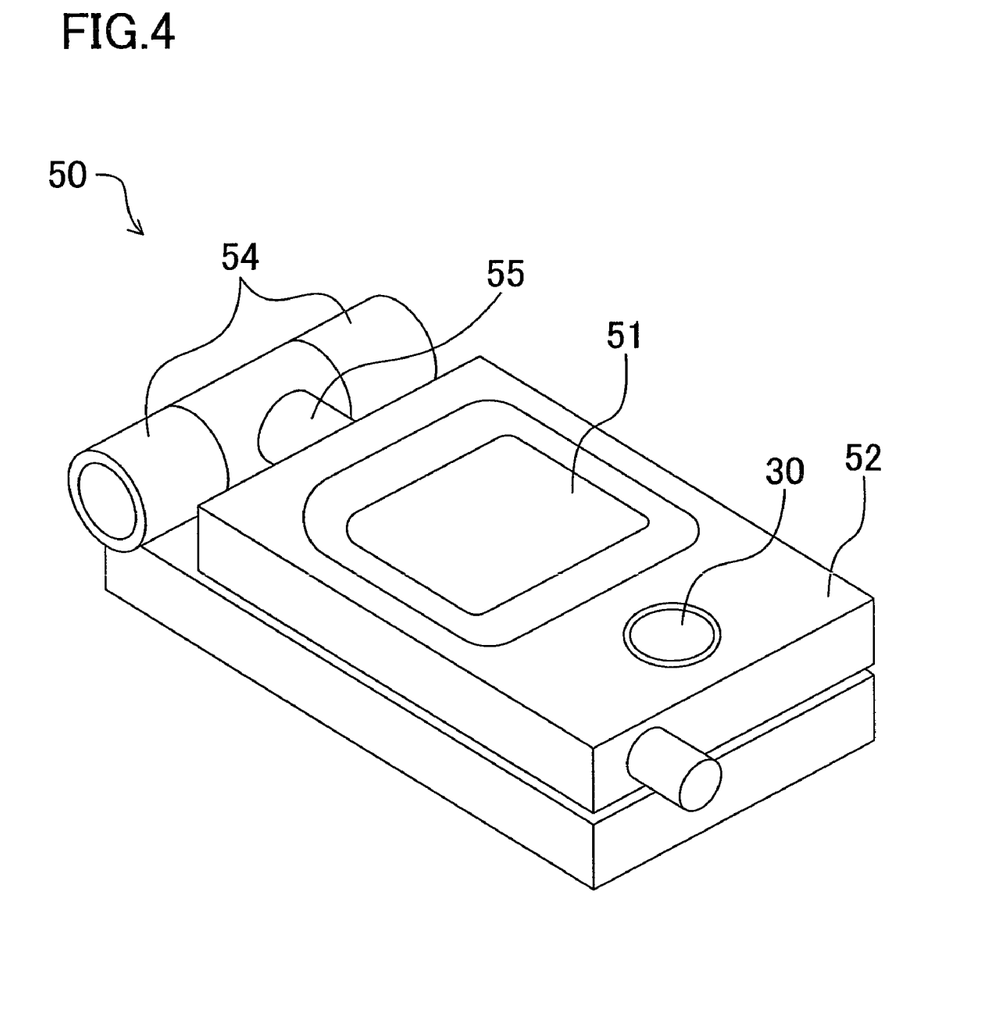
FIG. 4 is a perspective view showing an example of electronic equipment mounting the camera module according to the first embodiment of the present invention, which illustrates the case where the module is mounted to a cellular telephone.

FIG. 4 is a perspective view showing, as an example of electronic equipment mounting the above-shown camera module 30, the case where the camera module 30 is mounted to a cellular telephone 50.

Referring to FIG. 4, a small display 51 and the camera module 30 shown above are disposed on the surface of a display 52. The display 52 is opened and closed by hinges 54 and 55. The camera module 30 shown above can be used to provide smaller size and thickness than the conventional cellular telephone. The camera module 30 mounting the solid-state imaging device 10 according to the first embodiment can be used for not only the cellular telephone shown above but also various types of electronic equipment using camera modules, which are employed in the consumer field including digital cameras or in the medical field including cameras for endoscopes.

Figure 5:
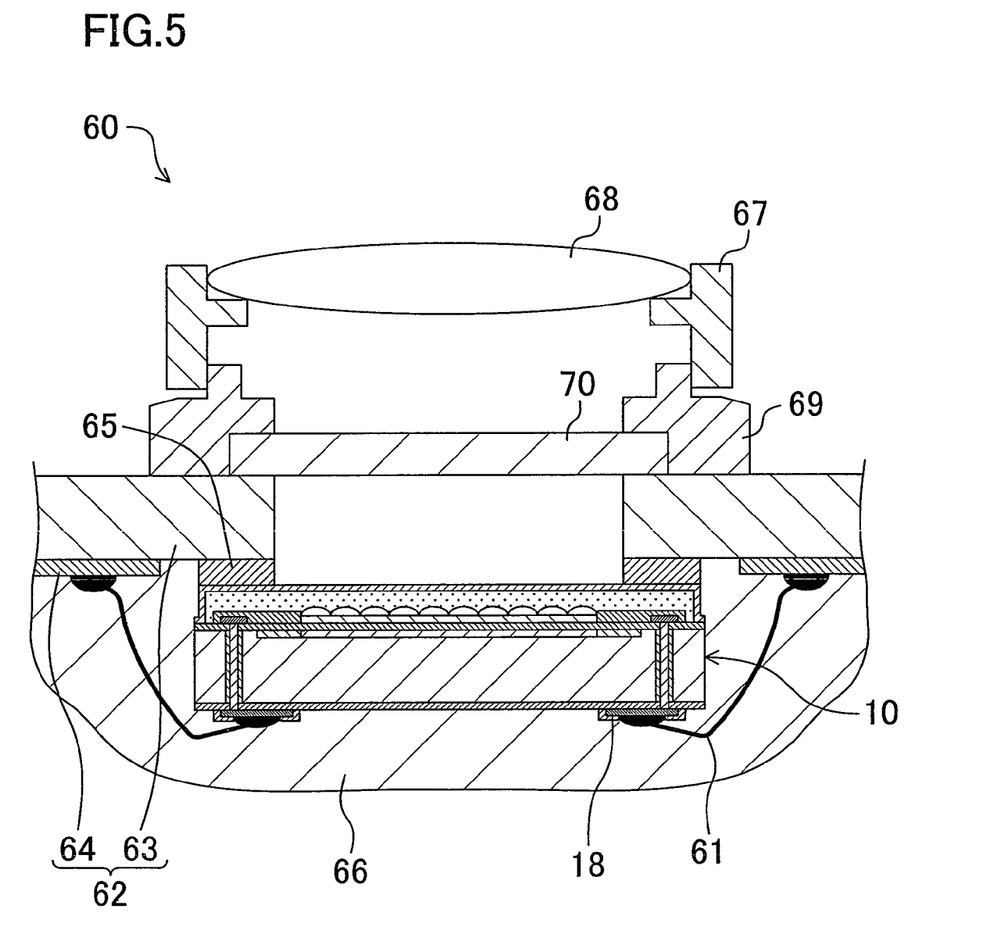
FIG. 5 is a sectional view showing the structure of a camera module as a second example which uses the solid-state imaging device according to the first embodiment of the present invention.

FIG. 5 is a sectional view showing the structure of a camera module 60 as a second example which uses the solid-state imaging device 10 according to the first embodiment.

Referring to FIG. 5, as in the case of the camera module 30 shown in FIG. 3, the camera module 60 includes a circuit substrate 62, the solid-state imaging device 10 mounted to the circuit substrate 62, and a lens 68 for producing an optical image on an imaging area of the solid-state imaging device 10.

As the circuit substrate 62, a substrate with a single-layer interconnect can be used which has an interconnect electrode 64 formed on one surface of a resin base 63 made of, for example, glass epoxy or the like. To the circuit substrate 62, the solid-state imaging device 10 according to the first embodiment adheres by adhesive resin 65 to make connection with the interconnect electrode 64. In the case of this camera module 60, as shown in FIG. 5, the external connection terminal 18 of the solid-state imaging device 10 and the interconnect electrode 64 of the circuit substrate 62 are connected to each other by a conductive member 61 of a metal wire. Preferably, a gold wire, an aluminum wire, or a copper wire is used as the conductive member 61. As the style of connection, wire bonding connection is simple and preferable.

Furthermore, the circuit substrate 62 is formed with an opening larger than the imaging area of the solid-state imaging device 10, and a housing 69 is fixed to the perimeter of this opening. A lens barrel 67 including the optical lens 68 is fixed onto the housing 69. An optical component 70 such as an infrared filter is also attached into the housing 69. In order to protect the solid-state imaging device 10 and the conductive member 61 made of a metal wire, sealing resin 66 is applied.

The camera module 60 is thus constructed, the solid-state imaging device 10 has small size and thickness, and the solid-state imaging device 10 and the housing 69 holding the optical lens 68 and the like are disposed to different surfaces of the circuit substrate 62. Thereby, the camera module 60 with smaller size and thickness can be provided. Moreover, like the camera module 30 shown in FIG. 3, the camera module 60 can also be mounted to the cellular telephone 50 shown in FIG. 4. This cellular telephone 50 with the camera module 60 mounted thereto can have a further reduced thickness as compared with the conventional one. Likewise, the camera module 60 can be used for various types of electronic equipment using camera modules, which are employed in the consumer field including digital cameras or in the medical field including cameras for endoscopes.

Second Embodiment

Figure 6A:
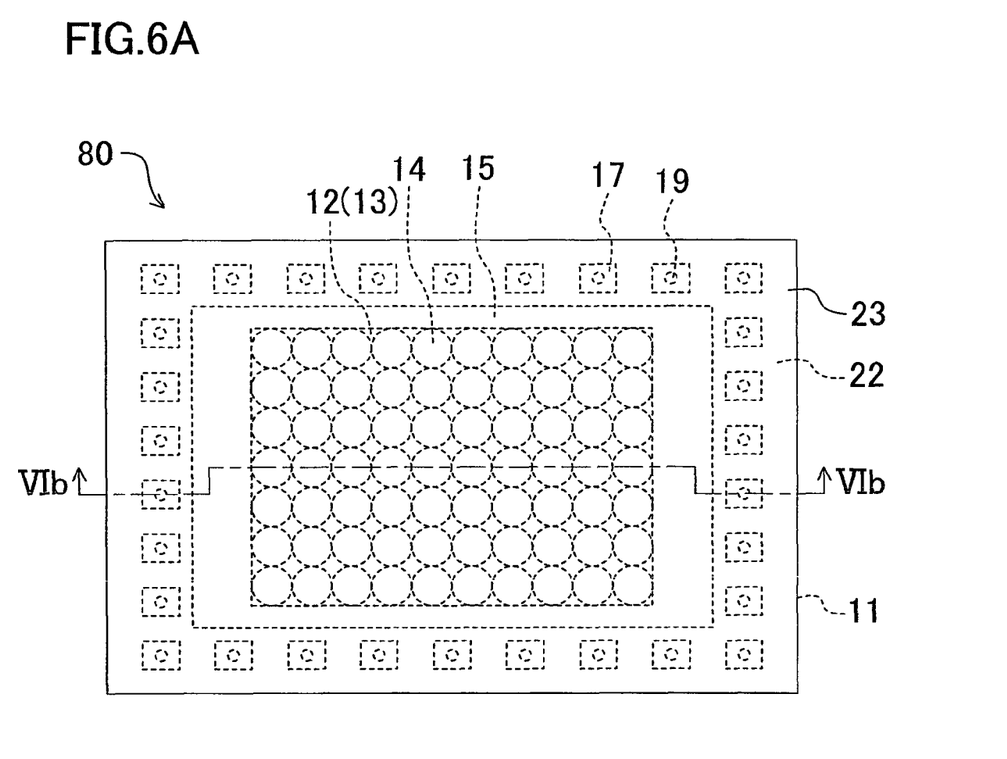
FIG. 6A is a plan view showing the structure of an optical device according to a second embodiment of the present invention.
Figure 6B:
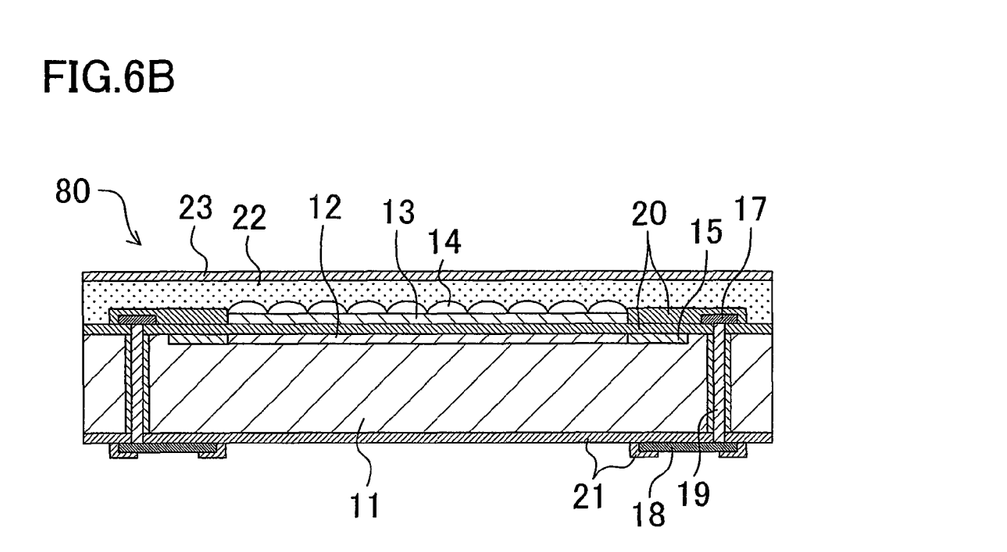
FIG. 6B is a sectional view taken along the line VIb-VIb in FIG. 6A.

FIGS. 6A and 6B are views showing the structure of an optical device according to a second embodiment of the present invention. FIG. 6A is a plan view thereof, and FIG. 6B is a sectional view taken along the line VIb-VIb. In the second embodiment, as the optical device, a solid-state imaging device employed in a digital camera and the like will be described as one example. In the following description, the optical device is represented as a solid-state imaging device 80.

In the solid-state imaging device 80 according to the second embodiment, a basic structure, materials, and the like are identical to the above-described solid-state imaging device 10 according to the first embodiment, and hence their description is not repeated.

Referring to FIGS. 6A and 6B, the solid-state imaging device 80 according to the second embodiment is characterized in that the planarization film 22 and the transparent protective film 23 are formed over the entire surface of the principal plane of the light receiving element chip including the outer circumference region. With such a structure, the solid-state imaging device 80 can be formed only by the procedure in which the planarization film 22 and the transparent protective film 23 are formed in the state of the light-receiving-element wafer formed with the microlenses 14 and the resulting wafer is subjected to dicing to cut the wafer into chips.

Hereinafter, a fabrication method of the solid-state imaging device 80 according to the second embodiment will be described in detail with reference to FIGS. 7A to 7D. FIGS. 7A to 7D are sectional views showing main process steps for explaining the fabrication method of the solid-state imaging device 80 according to the second embodiment.

Figure 7A:
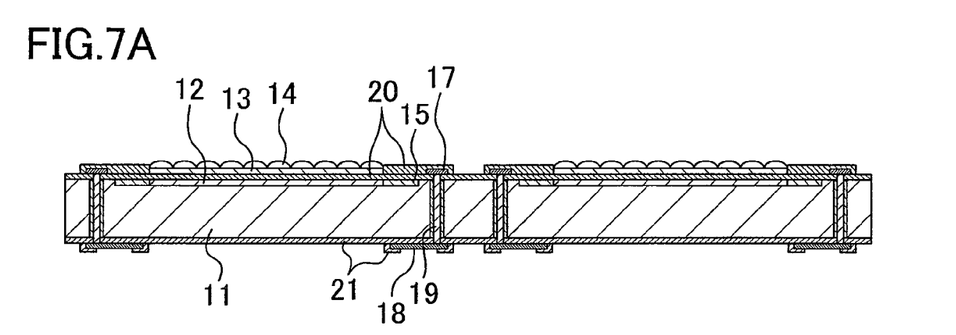
FIGS. 7A to 7D are sectional views showing main process steps for explaining the method for fabricating a solid-state imaging device according to the second embodiment of the present invention.
Figure 7B:
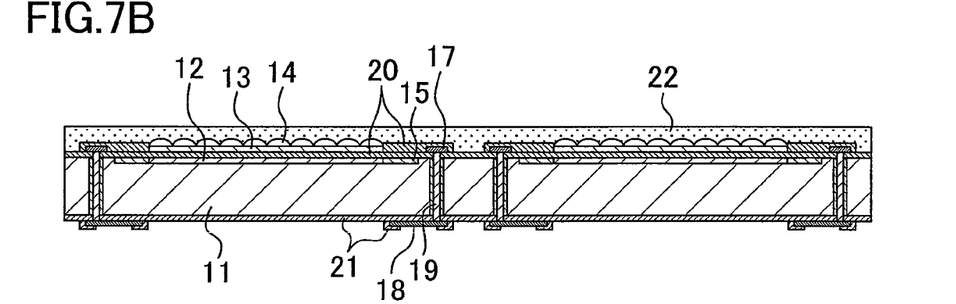

First, in the steps shown in FIGS. 7A and 7B, the steps in FIGS. 2A and 2B described in the fabrication method of the solid-state imaging device 10 according to the first embodiment are carried out in the same manner.

Figure 7C:
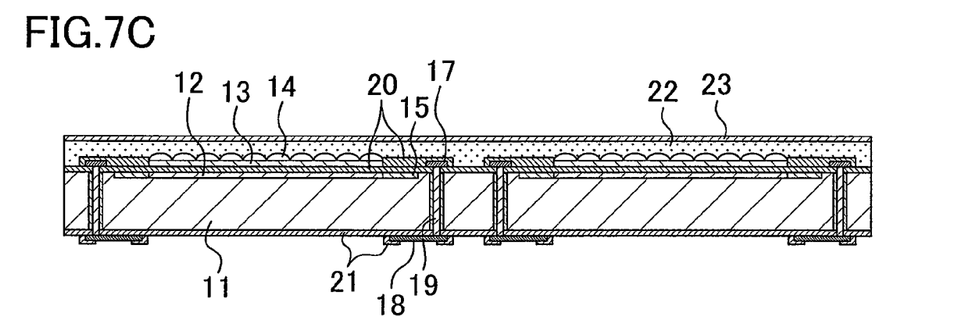

Next, as shown in FIG. 7C, in the state of the light-receiving-element wafer, the transparent protective film 23 made of a transparent inorganic material is formed on the planarization film 22. The material and the formation method of the transparent protective film 23 are identical to those in the fabrication method of the solid-state imaging device 10 according to the first embodiment. Before the formation step of the transparent protective film 23, the planarization film 22 may be polished or the surface of the planarization film 22 may be treated with, for example, oxygen plasma to conduct surface modification. By performing surface modification, the adherence between the transparent protective film 23 and the planarization film 22 can be improved.

Figure 7D:
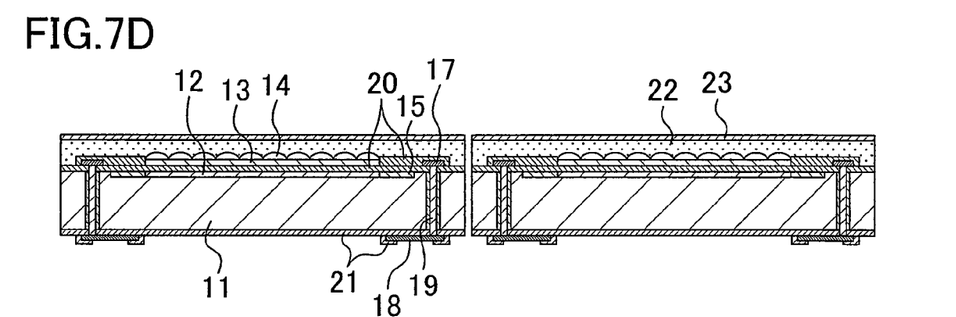

Subsequently, as shown in FIG. 7D, the resulting wafer is subjected to dicing along the dicing region to cut the wafer into chips, thereby fabricating the solid-state imaging device 80.

In the case where a camera module is constructed using the solid-state imaging device 80, either of the camera modules 30 and 60 described in the first embodiment can be constructed. In addition, like the first embodiment, the camera module thus constructed can be employed as a cellular telephone, a digital camera, or a camera for an endoscope.

The optical device according to the present invention is constructed so that the planarization film is formed over the principal plane to have a relatively great thickness and the transparent protective film is formed on the planarization film. Thereby, this device can have small size and thickness and excellent moisture resistance, and hence is useful in the field of mobile electronic equipment especially requiring size and thickness reduction.

What is claimed is:

1. An optical device comprising:
    a light receiving element chip having an active region, a circuit region, a penetrating conductor, and an external connection terminal, the active region being formed on a principal plane of a substrate and made by arranging a plurality of light receiving pixels, the circuit region being disposed around an outer circumference of the active region, the penetrating conductor being provided to penetrate the substrate in the thickness direction of the substrate, the external connection terminal being provided on a back surface of the substrate facing the principal plane thereof and connected to the penetrating conductor;
    a microlens provided over the active region to be associated with each of the light receiving pixels;
    a planarization film which is formed over the principal plane of the light receiving element chip to cover the microlens and planarize unevenness of the microlens and which is made of a transparent member having a lower refractive index than the microlens; and
    a transparent protective film formed on the planarization film and made of a transparent inorganic material transparent to visible light,
    wherein the transparent protective film is formed to continuously extend from a top surface of the planarization film to and along a side surface of the planarization film.

2. The device of claim 1, wherein
    the transparent protective film is formed to extend onto the principal plane of the outer circumference region of the light receiving element chip where the planarization film is not formed.

3. The device of claim 1,
    wherein the planarization film is made of a resin material and has a thickness 2 to 300 times the thickness of the microlens, and
    the transparent protective film has a smaller thickness than the planarization film.

4. A camera module comprising:
    a circuit substrate;
    a solid-state imaging device which is the optical device of claim 1 mounted to the circuit substrate; and
    a lens for producing an optical image on an imaging area formed of the active region of the solid-state imaging device.

5. Electronic equipment mounting the camera module of claim 4.

6. A method for fabricating an optical device, the method comprising the steps of:
    preparing a light-receiving-element wafer in which a plurality of light receiving element chips each including an active region, a circuit region, a penetrating conductor, and an external connection terminal are arranged at regular arrangement pitches, the active region being formed on a principal plane of a substrate and made by arranging a plurality of light receiving pixels, the circuit region being disposed around an outer circumference of the active region, the penetrating conductor being provided to penetrate the substrate in the thickness direction of the substrate, the external connection terminal being provided on a back surface of the substrate facing the principal plane thereof and connected to the penetrating conductor;

forming, in the state of the light-receiving-element wafer, a microlens over the active region to be associated with each of the light receiving pixels;

forming, in the state of the light-receiving-element wafer, a planarization film over the principal plane of the light receiving element chip to cover the microlens and planarize unevenness of the microlens, the planarization film being made of a transparent member having a lower refractive index than the microlens;

removing, in the state of the light-receiving-element wafer, portions of the planarization film located in and around a dicing region for cutting the wafer into the light receiving element chips, thereby exposing portions of the principal plane of the substrate;

forming, in the state of the light-receiving-element wafer, a transparent protective film to continuously extend from a top surface of the planarization film to and along a side surface of the planarization film, the transparent protective film being made of a transparent inorganic material transparent to visible light; and subjecting the light-receiving-element wafer to dicing along the dicing region to cut the wafer into chips.

7. The method of claim 6, further comprising the step of polishing the planarization film before the step of forming the transparent protective film.

8. The method of claim 6,
wherein the transparent protective film is formed by a chemical vapor deposition (CVD) method, a plasma assisted chemical vapor deposition (PCVD) method, a spin-on-glass (SOG) method, or a sol-gel method.

9. The device of claim 1,
wherein the planarization film is formed over the principal plane of the light receiving element chip to cover an area below which the penetrating conductor is provided.

10. The method of claim 6,
wherein the planarization film is formed over the principal plane of the light receiving element chip to cover an area below which the penetrating conductor is provided.

* * * * *